United States Patent [19]

Jean et al.

[11] Patent Number: 5,206,190

[45] Date of Patent: Apr. 27, 1993

[54] DIELECTRIC COMPOSITION CONTAINING CORDIERITE AND GLASS

[75] Inventors: Jau-Ho Jean, Export; Tapan K. Gupta, Monroeville, both of Pa.

[73] Assignee: Aluminum Company of America, Pittsburgh, Pa.

[21] Appl. No.: 576,853

[22] Filed: Sep. 4, 1990

[51] Int. Cl.$^5$ .............................................. C03C 1/00
[52] U.S. Cl. ...................................... 501/32; 501/77; 501/119; 501/65
[58] Field of Search .................. 501/32, 17, 73, 77, 501/66, 65, 119, 120, 121, 122

[56] References Cited

U.S. PATENT DOCUMENTS

| | | | |
|---|---|---|---|
| 3,926,648 | 12/1975 | Miller | 106/39.6 |
| 4,642,148 | 2/1987 | Kurihara et al. | 156/89 |
| 4,655,864 | 4/1987 | Rellick | 501/73 X |
| 4,672,152 | 6/1987 | Shinohara | 174/68.5 |
| 4,752,531 | 6/1988 | Steinberg | 428/426 |
| 4,755,490 | 7/1988 | DiLazzaro | 501/32 X |
| 4,788,046 | 11/1988 | Barringer et al. | 423/122 |
| 4,849,379 | 7/1989 | McCormick | 501/20 |
| 4,849,380 | 7/1989 | Sawhill | 501/17 X |
| 4,879,261 | 11/1989 | Burn | 501/32 |
| 5,019,194 | 1/1992 | Jean et al. | 501/17 |
| 5,070,046 | 12/1991 | Hu | 501/77 X |

FOREIGN PATENT DOCUMENTS 151645 6/1988 Japan.
179740 7/1989 Japan.

OTHER PUBLICATIONS

Abstracts for above JP references.

*Primary Examiner*—Karl Group
*Assistant Examiner*—Chris Gallo
*Attorney, Agent, or Firm*—David W. Pearce-Smith

[57] ABSTRACT

A glass-ceramic composition for forming a glass-ceramic dielectric body having a dielectric constant of less than about 4.5, a firing temperature of less than about 950° C. and a sintered density of greater than 95% theoretical density. The composition is formed from a mixture consisting essentially of finely divided particles of 40–50 vol. % borosilicate glass and 50–60 vol. % cordierite. The borosilicate glass comprises approximately 20–35 wt. % $B_2O_3$ and approximately 60–75 wt. % $SiO_2$. The exact particle size ratio of the cordierite to borosilicate glass that is used will depend on the proportions of the components, the desired fired density and the firing temperature. The mixture is fired at a temperature of less than 1000° C.

18 Claims, No Drawings

DIELECTRIC COMPOSITION CONTAINING CORDIERITE AND GLASS

FIELD OF THE INVENTION

The invention relates to dielectric compositions. More particularly the invention relates to glass and ceramic materials that are sintered at low temperatures to produce dense bodies having low coefficients of thermal expansion and a dielectric constant below 4.6.

BACKGROUND OF THE INVENTION

Conventionally, alumina ($Al_2O_3$) is used as a dielectric material for microelectronic packages. It has excellent electrical (insulating), thermal and mechanical (especially strength) properties. Alumina based packages generally containing 4–10 wt. % glass, require sintering temperatures above 1500° C., which necessitates the use of refractory metals such as molybdenum or tungsten for the electrical interconnections so that the metal can be co-fired with the package. These metals have poor electrical conductivity as compared to highly conductive metals such as copper, and secondly, they require the use of strongly reducing atmospheres during co-firing, necessitating expensive furnace systems.

The development of multilayer ceramic circuit boards is toward higher frequency, higher density and higher speed devices. $Al_2O_3$ has a relatively high dielectric constant of about 9.9, causing high signal propagation delay and low signal-to-noise ratio (crosstalk). The signal propagation delay (t) in ceramic substrates is affected by the effective dielectric constant of the substrate (k') in the following equation:

$$t = (k')^{0.5}/C$$

where C is the speed of light. It can be found that the signal propagation delay can be dramatically reduced by a reduction in the effective dielectric constant of the substrate. For example, if the dielectric constant of a material is reduced from 10 (approximately the k' of $Al_2O_3$) to 5, the signal propagation delay can be reduced by 30%. A small signal delay is especially important for the substrate housing a chip with a very dense integrated circuit, for instance, very large scale integrated circuit (VLSI).

Furthermore, alumina has a coefficient of thermal expansion of about $7.4 \times 10^{-6}/°C$. (in the 20°–200° C. range) as compared to $3.4 \times 10^{-6}/°C$. for silicon. This mismatch in thermal expansion results in design constraints and reliability concerns when attaching a silicon wafer to the substrate.

Heretofore, most of the dielectric materials used in multilayer circuits have been conventional thick film compositions. A typical circuit is constructed by sequentially printing, drying and firing functional thick film layers atop a ceramic substrate which is usually 92–96 wt. % $Al_2O_3$. The multiple steps required make this technology process intensive with the large number of process steps and yield losses contributing to high costs. Thick film technology nevertheless fills an important need in microelectronics and will continue to do so in the foreseeable future.

Recently, dielectric thick film compositions with low dielectric constant have been introduced. However, ceramic substrates with low dielectric constants less than 4.5 and thermal expansion coefficients equal to that of silicon (3.4 ppm/°C.) are not readily available.

Low temperature co-fired (LTCF) technology has been recently introduced as a method for fabricating multilayer circuits. This technology offers the combination of the processing advantages of HTCF technology and the materials advantages of thick film technology. These LTCF tape systems have firing temperatures below 1000° C. and allow the use of high conductivity metals such as silver, gold, silver/palladium and copper (copper, however, requires reducing atmospheres). Most of these tape systems have dielectric constants between 6 and 8 and encompass a range of thermal coefficient of expansion (TCE).

Currently, there is no readily available low temperature co-fired dielectric tape system using a glass plus ceramic approach that offers both low dielectric constant (less than 4.5) and a TCE matched to silicon (3.4 ppm/°C.).

PRIOR ART

A method for producing a multilayer ceramic circuit board for use with copper conductors is described in U.S. Pat. No. 4,642,148 issued to Kurihara et al. Ceramic compositions comprising 10–75 wt. % alpha-alumina, 5–70 wt. % non-crystalline quartz (fused silica), 20–60 wt. % borosilicate glass are disclosed. The dielectric constants of the fired materials ranged from 4.8 to 9.6.

U.S. Pat. No. 3,926,648 issued to Miller describes a process for sintering powdered crystallizable glasses having compositions approximating the stoichiometry of cordierite ($2MgO.2Al_2O_3.5SiO_2$) into cordierite. The cordierite bodies exhibit low coeffiecients of thermal expansion and contain hexagonal cordierite as the crystal phase.

U.S. Pat. No. 4,672,152 issued to Shinohara et al describes a multilayer ceramic circuit board in which the ceramic is prepared from a mixture of 50–95 wt. % crystallizable glass and 5–50 wt. % ceramic filler. The material has a dielectric constant between 5.1 and 6.0 and a flexural strength above 150 MPa. The crystallizable glass consists of 5–20 wt. % lithium oxide, 60–90 wt. % silicon dioxide, 1–10 wt. % aluminum oxide and 1–5 wt. % alkaline metal oxide other than lithium oxide. The ceramic filler is selected from the group of silicon dioxide, $\beta$-eucryptite $LiAlSiO_4$) and aluminum oxide.

U.S. Pat. No. 4,755,490 issued to DiLazzaro describes a low firing temperature ceramic materials having dielectric constants between 4.5 and 6.1. The materials had coefficient of thermal expansion between 3.9 and 4.2 cm/cm/°C. $\times 10^{-6}$. Example 11 shows k'=4.5 and TCE=3.9. The material is formed from a mixture of 10–50 wt. % alumina, 0–30 wt. % fused silica and 50–60 wt. % (approximately 60–70 vol. %) of a frit composed of about 4 wt. % CaO, about 12 wt. % MgO, about 29 wt. % $B_2O_3$, and about 42 wt. % $SiO_2$. The compositions are fired at a temperature below 1000° C.

U.S. Pat. No. 4,788,046 issued to Barringer et al describes a glass-ceramic packages for integrated circuits having low sintering temperature. The sintered compositions are formed by coating ceramic particles with glass, separating the coated particles from the glass and then forming the coated particles into a green compact. The material with the lowest dielectric constant (4.5) is obtained using quartz. This material had a thermal expansion coefficient greater than 5.5.

U.S. Pat. No. 4,849,379 issued to McCormick describes a composition for making low dielectric layers which is an admixture of finely divided solids. McCormick states that materials such as cordierite and mullite are not suitable for use on $Al_2O_3$ substrates because of TCE mismatch. In addition, McCormick states that compositions containing cordierite and mullite in conjunction with a low softening point glass in general tend to raise TCE, lower firing temperature and increase the dielectric constant of the composition.

U.S. Pat. No. 4,879,261 issued to Burn describes a low dielectric material having a dielectric less than 5.0. The material is formed from a mixture of finely divided particles consisting essentially of 70–85 wt. % silica and 15–30 wt. % zinc borax flux which is fired to 1065° C. in an oxidizing atmosphere. The composition can be used to make green tape and multilayer devices having internal copper conductors such as multilayer capacitors and multilayer interconnects.

From the foregoing, it can be seen that there is a substantial need for a low temperature co-fireable tape dielectric which (1) has a low dielectric constant (less than 4.5), (2) has a thermal expansion coefficient very close to the value for silicon (3.4 ppm/°C.), and (3) can be fired in air at a low temperature (less than 950° C.), thus permitting the use of high conductivity metallurgies such as gold, silver and silver/palladium.

The principal object of the invention is to provide a material that can be sintered into a body that has a dielectric constant of less than 4.5, a thermal expansion coefficient below 4.0 ppm/°C.), and can be fired in air at temperatures less than 950° C.

Another object of the invention is to provide ceramic materials that are sintered at low temperatures to produce dense bodies (greater than 95% of theoretical density) having low coefficients of thermal expansion and a dielectric constant below 4.5 and have a glass content between 35–55 vol. %. A reduction in the glass content of the sintered body is very desirable in that the glassy phase is responsible for shape distortion or warpage during co-firing. If the sintered body is to be used in an electronic package, the shape distortion associated with high volume percent glass content can cause the via holes to misalign during co-firing of the metal and ceramic. A glass content below 50 vol. % will reduce the likelihood that warpage will occur.

SUMMARY OF THE INVENTION

The invention is directed to a ceramic composition for forming a ceramic dielectric body having a dielectric constant of less than about 4.5, the composition being co-fireable with high conductivity metals such as gold, silver and silver/palladium. The composition comprises a mixture of finely divided particles of 40–60 vol. % borosilicate glass and 40–60 vol. % cordierite, where finely divided particles constitute particles less than about 70 $\mu$m.

A a second aspect of the invention is directed to forming a ceramic body having a sintered density greater than 95% of theoretical density. This is accomplished by a method that includes grinding the borosilicate glass so that the particle size ratio of the cordierite to borosilicate glass is greater than about seven. The exact particle size ratio of the cordierite to borosilicate glass that is used will depend on the the volume percent of the components, the desired fired density and the firing temperature.

In a further aspect, the invention is directed to an unfired green tape comprising the above composition dispersed in a polymeric binder.

In a further aspect, the invention is directed to a multilayer ceramic substrate comprising layers of the above composition and interconnected conductor layers of copper therebetween, the assemblage having been fired to form a dense hermetic structure.

In a yet another aspect, the invention is directed to a multilayer ceramic capacitor comprising layers of the above composition with conductor layers of copper therebetween, the assemblage having been fired to form a dense hermetic structure.

DETAILED DESCRIPTION OF THE INVENTION

The preferred glass plus ceramic composition of the present invention comprises a mixture of two principal components: borosilicate glass and cordierite. The percentages of each component may be varied within the ranges delineated below, depending on the final desired properties of the fired ceramic material. Dense ceramic bodies can be formed from such compositions by normal manufacturing techniques and low temperature (i.e., 850°–1000° C.) sintering. In a preferred application of the invention, such a mixture is formed into a thin tape, via holes punched through the tape at desired locations, and one or more metal conductor paths are formed on the punched tape. Suitable metals for the conductor paths include copper, silver, gold, platinum/gold and palladium/silver. The tape is subsequently sintered at low temperature, typically after two or more sections have been laminated together to form a multilayer circuit substrate.

Surprisingly, it has been found that low firing temperature glass plus ceramic compositions can be made from mixtures containing between 35–55 vol. % borosilicate glass. As stated above, a reduction in the glass content of the sintered body is very desirable in that the glassy phase is responsible for shape distortion or warpage during co-firing. A glass content below 50 vol. % will reduce the likelihood that warpage and misalignment of via holes will occur. Low firing temperature glass plus ceramic compositions of the invention are produced by providing a mixture of powdered ingredients, including 35–60 vol. % borosilicate glass and 40–60 vol. % cordierite, the borosilicate glass being composed of $Al_2O_3$, $B_2O_3$, CaO, $K_2O$, $Li_2O$, $Na_2O$ and $SiO_2$ in amounts such that the mixture has a softening point of 793° C. A quantity of the mixture is then formed into a desired shape using conventional procedures, and sintered at a temperature of at least 850° C., preferably 850°–950° C., and most preferably 900°–950° C. The sintering may be conducted in an oxidizing, neutral or reducing atmosphere.

In addition, it has been found that ceramic compositions having a sintered density greater than 95% of theoretical density can be made from mixtures containing less than 50 vol. % borosilicate glass. Surprisingly, if the particle size ratio of the cordierite to borosilicate glass in the composition is greater than about seven very high densities can be obtained. The exact ratio of the cordierite to borosilicate glass that is used will depend on the the volume percent of the components, the desired fired density and the firing temperature.

The term "glass plus ceramic" is used herein to describe a sintered ceramic composition which is formed from a mixture of crystalline ceramics and glass. The ceramic and glass phases of the "glass plus ceramic" composition remain distinct after firing. The glass in a "glass plus ceramic" system retains its glassy characteristic after firing and is said to be a non-crystallizable glass in that composition. The term "glass plus ceramic" is used herein to distinguish systems containing non-crystallizable glasses from "glass-ceramic" systems in which the glass undergoes a controlled devitrification during firing and becomes crystalline.

The term "borosilicate glass" is used herein to describe a family of glasses containing 20-35 weight percent boron oxide ($B_2O_3$) and 60-75 weight percent silicon oxide ($SiO_2$).

The term "cordierite" is a term well known in the art which is used herein to describe a crystalline magnesium aluminum silicates having the formula $Mg_2Al_4Si_5O_{18}$. Cordierite is relatively refractory and has a melting point of about 1460° C. In pure form it exhibits excellent electrical insulating properties and a coefficient of thermal expansion of 2.5 ppm/°C. in the range up to about 300° C.

The glasses can be prepared by conventional glassmaking techniques by mixing the desired components in the desired proportions and heating the mixture to form melt. As is well known in the art, heating is conducted to a peak temperature and for a time such that the melt becomes entirely liquid and homogeneous.

The above-described glasses are particularly desirable for use in electronic packages, such as VLSI applications, because of their low polarizability and thus low dielectric constant. A preferred borosilicate glass comprises about 0-1 wt. % $Al_2O_3$, 25-30 wt. % $B_2O_3$, 0-1 wt. % CaO, 0-1 wt. % $K_2O$, 0-1 wt. % $Li_2O$, 0-1 wt. % $Na_2O$, 0-0.5 wt. % $ZnO.B_2O_3$ and 65-75 wt. % $SiO_2$. The amount of borosilicate glass used affects the sintering temperature. If too little borosilicate glass is used (for example, less than about 25 vol. % in this embodiment), the sintering temperature will be too high to achieve the benefits of the present invention. Maintaining the proportion of borosilicate glass within the range of about 25-50 vol. % is necessary to obtain these benefits.

The cordierite composition used in the following examples is commerically available from ICD Inc. of Lyndhurst, N.J. and has a median particle size of seventy (70) microns.

The following examples illustrate preferred ranges of components of the glass plus ceramic compositions of the invention. In each example, the borosilicate glass is comprised of 0.98 wt. % $Al_2O_3$, 26.7 wt. % $B_2O_3$, 0.11 wt. % CaO, 0.84 wt. % $K_2O$, 0.78 wt. % $Li_2O$, 0.2 wt. % $Na_2O$ and 69.8 wt. % $SiO_2$ and has a median particle size of 14.5 microns.

EXAMPLE 1

In this example, the starting materials consisted essentially of 70 vol. % cordierite and 30 vol. % borosilicate glass. The borosilicate glass and the cordierite were separately ground in a 1.3 gallon ball mill for 16 hours to achieve a particle size of 2-4 microns. Portions of the material were removed from each gallon ball mill at roughly various time intervals and particle size of the materials as well as their ratios were recorded as shown in Table 1. The density of the borosilicate glass is 2.16 g/cc and the density of the cordierite is 2.55 g/cc. In this example the actual weight percent of the mixture is 73.4 wt. % cordierite and 26.6 wt. % borosilicate glass. This mixture of inorganic material was combined with 5 wt. % polyethylene glycol binder and 50 wt. % 1-propanol and mixed for 2 hours in a turbular mixer. The material was then oven dried at 80° C. for 2 hours and screened. The material was then dry pressed into 1.9 cm diameter, 0.3 cm high pellets by compressing the milled mixture in a mold at 13,000 psi (910 kg/cm²). The pellets were then fired in air. The firing was in two steps. The first step was to burn the binder out. This was accomplished by heating the pellets to 500° C. and holding for 1 hour. Next the pellets were sintered isothermally at various temperatures ranging from 850° C. to 950° C. for one hour. The sintered density of the sintered materials were determined by the water replacement method, according to ASTM procedure C373-72. Thermal expansion coefficients (TCE) were determined in the temperature range from room temperature to 200° C. by using a dilatometer. Dielectric constant and dielectric loss were determined by an HP 4192 AC impedance at 1 MHz. The sintered density of the material is reported in Table 1. It is found that the fired density for a given temperature increases as the particle size ratio of the coridierite to glass increases. The material with a cordierite to glass particle size ratio of over 5.5 has a density greater than 88% theoretical density (T.D.) at 900° and 950° C. Increasing the particle size ratio to over 37 by using coarser cordierite material does not yield a density greater than 89% theoretical density (T.D.) at 900° and 950° C.

TABLE 1

| Cordierite (μm) | Glass (μm) | Cord./Glass Size Ratio | Temperature (°C.) | | |
|---|---|---|---|---|---|
| | | | 850 | 900 | 950 |
| | | | Density (% T.D.) | | |
| 4.1 | 14.5 | 0.28 | 72.5 | 78.2 | — |
| 4.1 | 4.13 | 0.99 | 74.0 | 80.4 | 82.2 |
| 4.1 | 4.0 | 1.03 | 74.6 | 80.9 | 83.0 |
| 4.1 | 3.53 | 1.16 | 75.9 | 82.8 | 84.7 |
| 4.1 | 1.86 | 2.21 | 79.0 | 84.5 | — |
| 7.0 | 1.86 | 3.76 | 79.6 | 87.3 | 87.8 |
| 10.5 | 1.86 | 5.64 | 83.0 | 88.6 | 88.9 |
| 13.0 | 1.86 | 6.99 | 83.4 | — | — |
| 70.0 | 1.86 | 37.60 | 84.2 | 88.9 | 88.7 |

EXAMPLE 2

The procedure of Example 1 was repeated except that the inorganic composition is 60 vol. % cordierite and 40 vol. % borosilicate glass (63.9 wt. % and 36.1 wt. %, respectively). The sintered density of the material is reported in Table 2. The fired density of the sintered ceramic material is found to increase as the particle size ratio of the coridierite to glass increases. The material with a cordierite to glass size ratio of 10.3 has a density of approximately 95% theoretical density (T.D.) at 900° C. Increasing the particle size ratio to over 11.5 by using coarser cordierite material increases the density to greater than 97% theoretical density (T.D.) at 900°. The dielectric constant (k'), dissipation factor (D.F.) and linear thermal coefficient of expansion (TCE) of the material formed using a particle size ratio of 11.9 are recorded in Table 3.

TABLE 2

| Cordierite (μm) | Glass (μm) | Cord./Glass Size Ratio | Temperature (°C.) | | |
|---|---|---|---|---|---|
| | | | 850 | 900 | 950 |
| | | | Density (% T.D.) | | |
| 4.1 | 14.5 | 0.28 | — | 79.9 | — |
| 4.1 | 1.86 | 2.15 | — | 87.5 | — |
| 13.0 | 1.86 | 6.98 | — | 92.6 | — |
| 13.0 | 1.26 | 10.30 | — | 94.8 | — |

TABLE 2-continued

| Cordierite (μm) | Glass (μm) | Cord./Glass Size Ratio | Temperature (°C.) 850 | 900 | 950 |
|---|---|---|---|---|---|
| 15.0 | 1.26 | 11.90 | — | 97.5 | — |

TABLE 3

| Example | Vol. % Cord. | Ratio | °C. | k' | D.F.(%) | TCE (ppm/C) |
|---|---|---|---|---|---|---|
| 2 | 60 | 11.9 | 900 | 4.3–4.5 | 0.2–0.25 | 2.5–3.5 |
| 3 | 50 | 4.1 | 900 | 4.3–4.4 | 0.2–0.3 | 3.0–3.5 |
| 4 | 40 | 0.99 | 900 | 4.4–4.6 | 0.2–0.3 | 3.0–3.5 |

EXAMPLE 3

The procedure of Example 1 was repeated except that the inorganic composition is 50 vol. % cordierite and 50 vol. % borosilicate glass (54.1 wt. % and 45.9 wt. %, respectively). The sintered density of the material is reported in Table 4. The fired density of the sintered ceramic material is found to increase as the particle size ratio of the coridierite to glass increases. The material with a cordierite to glass particle size ratio of 4.1 has a density of approximately 99% theoretical density (T.D.) at 900° C. The dielectric constant (k'), dissipation factor (D.F.) and linear thermal coefficient of expansion (TCE) of the material formed using a particle size ratio of 4.1 are recorded in Table 3.

TABLE 4

| Cordierite (μm) | Glass (μm) | Cord./Glass Size Ratio | Temperature (°C.) 850 | 900 | 950 |
|---|---|---|---|---|---|
|  |  |  | Density (% T.D.) | | |
| 4.1 | 10.5 | 0.39 | 83.1 | 87.8 | 88.9 |
| 4.1 | 4.13 | 0.99 | 86.9 | 92.7 | 93.4 |
| 4.1 | 1.0 | 4.1 | 93.9 | 99.2 | 97.8 |

EXAMPLE 4

The procedure of Example 1 was repeated except that the inorganic composition is 40 vol. % cordierite and 60 vol. % borosilicate glass (44 wt. % and 56 wt. %, respectively). The sintered density of the material is reported in Table 5. The resulting sintered ceramic material is determined to have a density greater than 95% theoretical density (T.D.) at temperatures greater than 850° C. As the firing temperature increased, the fired density is found to increase. The dielectric constant (k'), dissipation factor (D.F.) and linear thermal coefficient of expansion (TCE) of the material are recorded in Table 3. The high glass content used in this example i.e. not desirable for use in multilayer ceramic packages because of the likelihood of shape distortion during co-firing of the ceramic and metal.

TABLE 5

| Cordierite (μm) | Glass (μm) | Cord./Glass Size Ratio | Temperature (°C.) 850 | 900 | 950 |
|---|---|---|---|---|---|
|  |  |  | Density (% T.D.) | | |
| 4.1 | 4.13 | 0.99 | 95.8 | 97.8 | 98.3 |

The products of Examples 1–3 contain a low glass content (30–50 vol. %) which is much less than those reported in the literature (greater than 60 vol. %). A low glass content is very desirable, because the shape distortion can be avoided during co-firing. However, the composition of Example 1 (70 vol. % cordierite) does not achieve a fired density that is adequate for multilayer ceramic packages.

From Examples 1–3 it can be seen that the an increase in the firing temperature and/or the particle size ratio of the cordierite to glass components will increase the fired density. If the particle size ratio of the cordierite to glass in Examples 2–4 is sufficiently high, then high sintered densities (greater than 95% of the theoretical density) can be obtained at firing temperatures of about 900° C. in air. The sintering temperatures are compatible with those of precious metals, e.g., Au and Ag-Pd, which will enable the compositions to be utilized in a co-firable ceramic/metal electronic packaging system.

The materials of Examples 2–4 are also found to have low dielectric constants (4.3–4.6) and low dielectric losses (0.2–0.3% at 1 MHz) which are very desirable to reduce signal propagation delay in the ceramic substrate.

The materials of Examples 2–3 can be used to form multilayer high frequency circuit packages. The material of Example 1 is undesireable because it does not achieve a high sintered density. The material of Example 4 is undesireable because it contains too much glass and the likelihood of shape distortion during co-firing of the ceramic and metal is too high.

To form dielectric layers for multilayer high frequency circuit packages, the starting materials are ground in a ball mill until they can be combined in a particle size ratio that wil yield the desired density. A slurry is then formed by combining the finely ground powder with a suitable solvent and other conventional additives, such as a plasticizer and a binder, in a manner known in the art. The slurry is cast into thin "green" (unfired) sheets having a thickness of about 75 to 400 microns using a conventional doctor blading process, after which the green sheets are blanked into individual 125 mm square sheets or tapes. Via holes next are formed in the green sheets by a die punching process. The holes suitably may have a diameter of about 125 microns. A conductor paste is applied in a desired pattern to the punched sheets using a screen printing process. The paste is also applied within the via holes to form connections between conductor patterns. The principal metallic constituent of the paste may be gold, silver, copper, silver/palladium alloy, gold/platinum alloy, or other suitable materials. The printed green sheets are then stacked in a desired sequence using alignment holes to insure correct positioning, and laminated together at 50°–100° C. under a pressure between about 35 and 250 kg/cm$^2$. Finally, the laminated green sheets are fired at a temperature not exceeding 1000° C. to form dense, sintered ceramic multilayer circuit substrates. The firing may be done in air if the conductor metal is not susceptible to oxidation at the firing temperature. Such is the case, for example, with the metals named above, except for copper, which requires a reducing or neutral atmosphere. Sheets formed in the manner described will have a lower glass content (25–50 vol. %) and therefore a lower tendency to bow or warp.

The compositions of the present invention also can be used to form rigid, nonporous ceramic bodies by substantially conventional techniques. For example, the batch ingredients of any of the previous examples are combined with water and organic binders, and ball milled for a period of about 20 hours. The resulting slurry is spray dried to provide a mixture of substantially spherical particles. This powder can be used to form bodies of various desired shapes by standard forming techniques, such as dry or isostatic pressing. The bodies are then fired at a suitable temperature not exceeding 1000° C. to provide dense, sintered ceramic objects.

It will be apparent to those skilled in the relevant art that various changes and modifications may be made in the embodiments described above to achieve the same or equivalent results without departing from the principles of the present invention as described and claimed herein. All such changes and modifications are intended to be covered by the following claims.

What is claimed is:

1. A glass-ceramic composition for forming a glass-ceramic dielectric body having a dielectric constant of less than about 4.5, a thermal expansion coefficient of less than about 4.0 ppm/°C., a firing temperature of less than about 950° C. and a sintered density of greater than 95% theoretical density, said composition consisting essentially of a mixture of finely divided particles of:
   (a) 40-50 volume percent borosilicate glass containing 20-35 wt. % boron oxide and 60-75 wt. % silicon oxide; and
   (b) 50-60 volume percent cordierite.

2. The glass ceramic composition of claim 1 in which the borosilicate glass has the composition:
   0-3 wt. % alumina, 20-30 wt. % $B_2O_3$, 0-3 wt. % CaO, 0-3 wt. % $K_2O$, 0-3 wt. % $Li_2O$, 0-3 wt. % $Na_2O$, and 60-80 wt. % $SiO_2$.

3. The glass ceramic composition of claim 1 wherein the formed ceramic dielectric body has a thermal expansion coefficient in the range of about 2.5-3.5 ppm/°C.

4. The glass ceramic composition of claim 1 in which the mixture of finely divided particles is dispersed in an organic medium.

5. The glass ceramic composition of claim 4 in which the organic medium is comprised of a polymeric binder dissolved in an organic solvent.

6. The glass ceramic composition of claim 5 in which the organic solvent is a volatile solvent and the dispersion is of castable consistency.

7. A castable glass-ceramic composition for forming a glass-ceramic dielectric body having a dielectric constant of less than about 4.5, a thermal expansion coefficient of less than about 4.0 ppm/°C., said composition consisting essentially of:
   (a) 70-85 wt. % of a mixture consisting essentially of finely divided particles of 40-50 volume percent borosilicate glass containing 20-35 wt. % boron oxide and 60-75 wt. % silicon oxide and 50-60 volume percent cordierite;
   (b) 15-30 wt. % of an organic medium comprised of a polymeric binder dissolved in an organic solvent.

8. A glass-ceramic composition for forming a glass-ceramic dielectric body having a dielectric constant of less than about 4.5 and a sintered density greater than 95% of theoretical density, said composition consisting essentially of a mixture of finely divided particles of less than about 70 μm:
   (a) 35-35 volume percent borosilicate glass containing 20-35 wt. % boron oxide and 60-75 wt. % silicon oxide; and
   (b) 55-65 volume percent cordierite, the particle size ratio of (b) to (a) being greater than about eleven.

9. The glass ceramic composition of claim 8 in which the borosilicate glass has the composition:
   0—3 wt. % alumina, 20-30 wt. % $B_2O_3$, 0-3 wt. % CaO, 0-3 wt % $K_2O$, 0-3 wt. % $Li_2O$, 0.-3 wt. % $Na_2O$, and 60-80 wt. % $SiO_2$.

10. A glass-ceramic composition for forming a glass-ceramic dielectric body having a dielectric constant of less than about 4.5 and a sintered density greater than 95% of theoretical density, said composition consisting essentially of a mixture of finely divided particles of less than about 70 μm:
    (a) 45-55 volume percent borosilicate glass containing 20-35 wt. % boron oxide and 60-75 wt. % silicon oxide; and
    (b) 45-55 volume percent cordierite, the particle size ratio of (b) to (a) being greater than about four.

11. The glass ceramic composition of claim 10 in which the borosilicate glass has the composition:
    0-3 wt. % alumina, 20-30 wt. % $B_2O_3$, 0-3 wt. % CaO, 0-3 wt. % $K_2O$, 0-3 wt. % $Li_2O$, 0-3 wt. % $Na_2O$, and 60-80 wt. % $SiO_2$.

12. The glass-ceramic composition of claim 1 in which said borosilicate glass contains less than about 3 wt. % alkali oxides.

13. The glass-ceramic composition of claim 1 in which said glass-ceramic composition has a dielectric loss of less than 0.3.

14. A glass-ceramic composition for forming a glass-ceramic dielectric body having a dielectric constant of less than about 4.5, a firing temperature of less than about 950° C. and a sintered density of greater than 95% theoretical density, said composition formed from a mixture consisting essentially of:
    (a) 40-50 volume percent borosilicate glass containing 20-35 wt. % boron oxide, 60-75 wt. % silicon oxide and less than about 3 wt. % alkali oxides; and
    (b) 50-60 volume percent cordierite.

15. The glass-ceramic composition of claim 14 in which said glass-ceramic has a dielectric loss of less than 0.3.

16. The glass-ceramic composition of claim 14 in which said glass-ceramic has a thermal expansion coefficient of less than about 4.0 ppm/°C.

17. A glass-ceramic composition for forming a glass-ceramic dielectric body having a dielectric constant of less than about 4.5, a dielectric loss of less than 0.3, a firing temperature of less than about 950° C. and a sintered density of greater than 95% theoretical density, said composition formed from a mixture consisting essentially of:
    (a) 40-50 volume percent borosilicate glass containing 20-35 wt. % boron oxide and 60-75 wt. % silicon oxide and less than about 3 wt. % alkali oxides; and
    (b) 50-60 volume percent cordierite.

18. The glass-ceramic composition of claim 17 in which said glass-ceramic has a thermal expansion coefficient of less than about 4.0 ppm/°C.

* * * * *

UNITED STATES PATENT AND TRADEMARK OFFICE
CERTIFICATE OF CORRECTION

PATENT NO. : 5,206,190
DATED : April 27, 1993
INVENTOR(S) : Jau-Ho Jean et al

It is certified that error appears in the above-indentified patent and that said Letters Patent is hereby corrected as shown below:

Col. 9, line 33  After "formed", insert --glass- --.
Claim 3

Col. 10, line 1  Change "35-35" to --35-45--.
Claim 8

Signed and Sealed this

Twenty-sixth Day of April, 1994

Attest:

BRUCE LEHMAN

*Attesting Officer*   Commissioner of Patents and Trademarks